(12) United States Patent
Kruijt-Stegeman et al.

(10) Patent No.: US 7,946,837 B2
(45) Date of Patent: May 24, 2011

(54) IMPRINT LITHOGRAPHY

(75) Inventors: Yvonne Wendela Kruijt-Stegeman, Eindhoven (NL); Johan Frederik Dijksman, Weert (NL); Sander Frederik Wuister, Eindhoven (NL); Ivar Schram, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 380 days.

(21) Appl. No.: 11/543,998

(22) Filed: Oct. 6, 2006

(65) Prior Publication Data

US 2008/0145774 A1 Jun. 19, 2008

(51) Int. Cl.
*B28B 17/00* (2006.01)
*B29C 59/00* (2006.01)

(52) U.S. Cl. ......... 425/150; 425/149; 425/385; 264/293

(58) Field of Classification Search ................. 425/385, 425/149, 150; 264/293
See application file for complete search history.

(56) References Cited

U.S. PATENT DOCUMENTS

| | | | |
|---|---|---|---|
| 4,731,155 A | 3/1988 | Napoli et al. ................. 156/643 |
| 5,772,905 A | 6/1998 | Chou ............................. 216/44 |
| 6,180,239 B1 | 1/2001 | Whitesides et al. ....... 428/411.1 |
| 6,334,960 B1 | 1/2002 | Willson et al. .................. 216/52 |
| 7,202,935 B2 | 4/2007 | Lee et al. |
| 7,296,519 B2 | 11/2007 | Dona et al. |
| 7,420,654 B2 | 9/2008 | Cherala et al. |
| 7,459,701 B2 | 12/2008 | Baggen et al. |
| 2004/0124566 A1 | 7/2004 | Sreenivasan et al. ......... 264/494 |
| 2005/0006343 A1* | 1/2005 | Choi et al. ..................... 216/59 |
| 2005/0173049 A1 | 8/2005 | Dona et al. |
| 2005/0178280 A1 | 8/2005 | Lee et al. |
| 2005/0189767 A1 | 9/2005 | Lancien |
| 2005/0269745 A1 | 12/2005 | Cherala et al. |
| 2005/0274693 A1 | 12/2005 | Heidari et al. ................. 216/52 |
| 2007/0126150 A1 | 6/2007 | GanapathiSubramanian et al. |

FOREIGN PATENT DOCUMENTS

| | | |
|---|---|---|
| JP | 04-158364 | 6/1992 |
| JP | 2006-018975 A | 1/2006 |
| JP | 2006-510223 T | 3/2006 |
| JP | 2006-352115 A | 12/2006 |
| WO | WO 02/067055 A2 | 8/2002 |
| WO | WO 02/067055 A3 | 8/2002 |
| WO | 03-099463 | 12/2003 |
| WO | 2004/006076 | 1/2004 |

(Continued)

OTHER PUBLICATIONS

Haisma et al., "Mold-Assisted Nanolithography: A Process for Reliable Pattern Replication," J. Vac. Sci. Technol. B 14(6), American Vacuum Society, Nov./Dec. 1996, pp. 4124-4128.

(Continued)

*Primary Examiner* — Maria Veronica D Ewald
(74) *Attorney, Agent, or Firm* — Pillsbury Winthrop Shaw Pittman LLP

(57) ABSTRACT

In an embodiment, an imprint lithography apparatus is disclosed that includes a support structure configured support an imprint template, the imprint template having a neutral plane which substantially bisects the imprint template, and an actuator located in a position such that, when the imprint template is supported by the support structure, the actuator is located between the support structure and a side of the imprint template, wherein the actuator is configured to meet the imprint template at a location which is displaced from the neutral plane of the imprint template.

30 Claims, 8 Drawing Sheets

FOREIGN PATENT DOCUMENTS

| | | |
|---|---|---|
| WO | 2005-006076 | 1/2005 |
| WO | 2005-078779 | 8/2005 |
| WO | 2005-121892 | 12/2005 |
| WO | 2007-064386 A1 | 6/2007 |

OTHER PUBLICATIONS

Japanese Office Action mailed Sep. 29, 2010 in corresponding Japanese patent application No. 2007-252991.

Japanese Office Action mailed Jan. 19, 2011 in Japanese patent application No. 2007-252991.

Pil J. Yoo et al., "Unconventional Patterning with a Modulus-Tunable Mold: From Imprinting to Microcontact Printing," Chemistry of Materials, vol. 16, No. 24, Nov. 6, 2004, pp. 5000-5005.

B. Michel et al., "Printing Meets Lithography: Soft Approaches to High-Resolution Patterning," IBM. J. Res. & Dev., vol. 45, No. 5, Sep. 2001, pp. 697-719.

H. Schmid et al., "Siloxane Polymers for High-Resolution, High-Accuracy Soft Lithography," Macromolecules, vol. 33, No. 8, Mar. 25, 2000, pp. 3042-3049.

* cited by examiner

IMPRINT LITHOGRAPHY

FIELD

The present invention relates to imprint lithography.

BACKGROUND

In lithography, there is an ongoing desire to reduce the size of features in a lithographic pattern to increase the density of features on a given substrate area. In photolithography, the push for smaller features has resulted in the development of technologies such as immersion lithography and extreme ultraviolet (EUV) lithography, which are however rather costly.

A potentially less costly road to smaller features that has gained increasing interest is so-called imprint lithography, which generally involves the use of a template to transfer a pattern onto a substrate. An advantage of imprint lithography is that the resolution of the features is not limited by, e.g., the wavelength of a radiation beam or the numerical aperture of a projection system as in photolithography, but mainly just by the pattern density on the template (also referred to as a stamp). There are three main approaches to imprint lithography, examples of which are schematically depicted in FIGS. 1a to 1c.

FIG. 1a shows an example of a type of imprint lithography that is often referred to as micro-contact printing. Micro-contact printing involves transferring a layer of molecules 11 (typically an ink such as a thiol) from a template 10 (e.g. a polydimethylsiloxane (PDMS) template) onto a resist layer 13 which is supported by a substrate 12 and planarization and transfer layer 12'. The template 10 has a pattern of features on its surface, the molecular layer being disposed upon the features. When the template is pressed against the resist layer, the layer of molecules 11 are transferred onto the resist. After removal of the template, the resist is etched such that the areas of the resist not covered by the transferred molecular layer are etched down to the substrate. For more information on micro-contact printing, see e.g. U.S. Pat. No. 6,180,239.

FIG. 1b shows an example of so-called hot imprint lithography (or hot embossing). In a typical hot imprint process, a template 14 is imprinted into a thermosetting or a thermoplastic polymer resin 15, which has been cast on the surface of a substrate 12. The resin may, for instance, be spin coated and baked onto the substrate surface or, as in the example illustrated, onto a planarization and transfer layer 12'. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template may then be removed and the patterned resin cooled. In hot imprint lithography employing a layer of thermoplastic polymer resin, the thermoplastic resin is heated so that it is in a freely flowable state immediately prior to imprinting with the template. It may be necessary to heat a thermoplastic resin to a temperature considerably above the glass transition temperature of the resin. The template is pressed into the flowable resin and then cooled to below its glass transition temperature with the template in place to harden the pattern. Thereafter, the template is removed. The pattern will comprise the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. Nos. 4,731,155 and 5,772,905.

FIG. 1c shows an example of UV imprint lithography, which involves the use of a transparent template and a UV-curable liquid as resist (the term "UV" is used here for convenience but should be interpreted as including any suitable actinic radiation for curing the resist). A UV curable liquid is often less viscous than a thermosetting or thermoplastic resin used in hot imprint lithography and consequently may move much faster to fill template pattern features. A quartz template 16 is applied to a UV-curable resin 17 in a similar manner to the process of FIG. 1b. However, instead of using heat or temperature cycling as in hot imprint, the pattern is "frozen" by curing the resin with UV radiation that is applied through the template onto the resin. After removal of the template, the pattern will comprise the features in relief from a residual layer of the resin which may then be removed by an appropriate etch process to leave only the pattern features. A particular manner of patterning a substrate through UV imprint lithography is so-called step and flash imprint lithography (SFIL), which may be used to pattern a substrate in a number of subsequent steps in a similar manner to optical steppers conventionally used in, e.g., IC manufacture. For more information on UV imprint, see e.g. U.S. patent application publication no. 2004-0124566, U.S. Pat. No. 6,334,960, PCT patent application publication no. WO 02/067055, and the article by J. Haisma entitled "Mold-assisted nanolithography: A process for reliable pattern replication", J. Vac. Sci. Technol. B 14(6), November/December 1996.

Combinations of the above imprint techniques are also possible. See, e.g., U.S. patent application publication no. 2005-0274693, which mentions a combination of heating and UV curing a resist.

In the above mentioned approaches to imprint lithography, especially hot imprint lithography and UV imprint lithography, an imprintable material (e.g., imprint liquid) is sandwiched between a substrate and a template to form a thin continuous layer over the entire area of the template. When the imprintable material is sandwiched between the substrate and the template, the material is expelled outwardly to, ultimately, form a thin continuous layer of material. At the same time, gas (e.g., air) present between the template and the substrate is also sandwiched. As the template is comes closer to the substrate it is more difficult for the imprintable material and gas to flow outwardly and around features of the template. The closer the template is to the substrate, the more slowly the imprintable material flows. Thus, since the imprintable material flows slowly, the time taken to form a thin continuous layer increases. Similarly, the closer the template is to the substrate, the longer it takes to expel gas from between the imprint template and the substrate. It is also possible that gas sandwiched between the template and the substrate may become trapped, forming gas bubbles which introduce defects into the imprint pattern.

SUMMARY

According to an aspect of the invention, there is provided an imprint lithography apparatus comprising an imprint template supported by a support structure, and an actuator located between the support structure and a side of the imprint template, the imprint template having a neutral plane which substantially bisects the imprint template, wherein the actuator meets the imprint template at a location which is displaced from the neutral plane of the imprint template.

According to an aspect of the invention, there is provided an imprint lithography apparatus, comprising an imprint template holder, suitable to hold an imprint template, the imprint template holder being supported by a support structure; and an actuator located between the support structure and a side of the imprint template holder, the imprint template holder having a neutral plane which substantially bisects the imprint template holder, wherein the actuator meets the imprint template holder at a location which is displaced from the neutral plane of the imprint template holder.

According to an aspect of the invention, there is provided an imprint lithography method, comprising applying a force to a side of an imprint template, the imprint template having a neutral plane which substantially bisects the imprint template, the force being applied at a location which is displaced from the neutral plane of the imprint template, application of the force causing the imprint template to bend and form an outwardly curved surface.

According to an aspect of the invention, there is provided an imprint lithography method, comprising applying a force to a side of an imprint template holder that is holding an imprint template, the imprint template holder having a neutral plane which substantially bisects the imprint template holder, the force being applied at a location which is displaced from the neutral plane of the imprint template holder, application of the force causing the imprint template holder to bend, the bending of the template holder causing the imprint template to bend and to form an outwardly curved surface.

According to an aspect of the invention, there is provided an imprint lithography apparatus, comprising a support structure configured support an imprint template, the imprint template having a neutral plane which substantially bisects the imprint template; and an actuator located in a position such that, when the imprint template is supported by the support structure, the actuator is located between the support structure and a side of the imprint template, wherein the actuator is configured to meet the imprint template at a location which is displaced from the neutral plane of the imprint template.

According to an aspect of the invention, there is provided an imprint lithography apparatus comprising a support structure configured to support an imprint template holder, the support structure being provided with an actuator, the actuator being located in a position such that, when the imprint template holder is supported by the support structure, the actuator is located between the support structure and a side of the imprint template holder, the imprint template holder having a neutral plane which substantially bisects the imprint template holder, wherein the actuator is configured to meet the imprint template holder at a location which is displaced from the neutral plane of the imprint template holder.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1A:
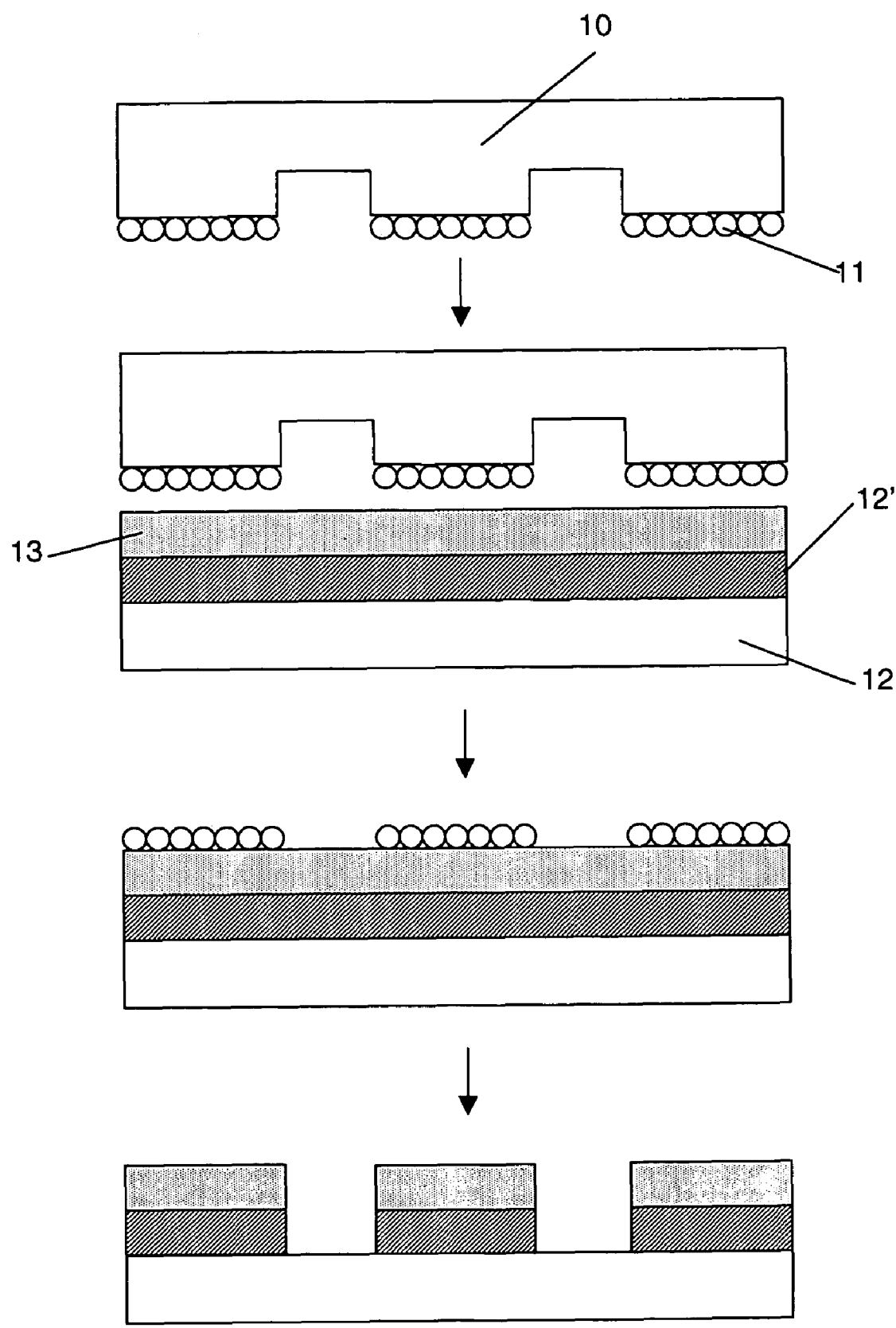
FIGS. 1a-c schematically show examples of, respectively, micro-contact printing, hot imprint, and UV imprint.
Figure 1B:
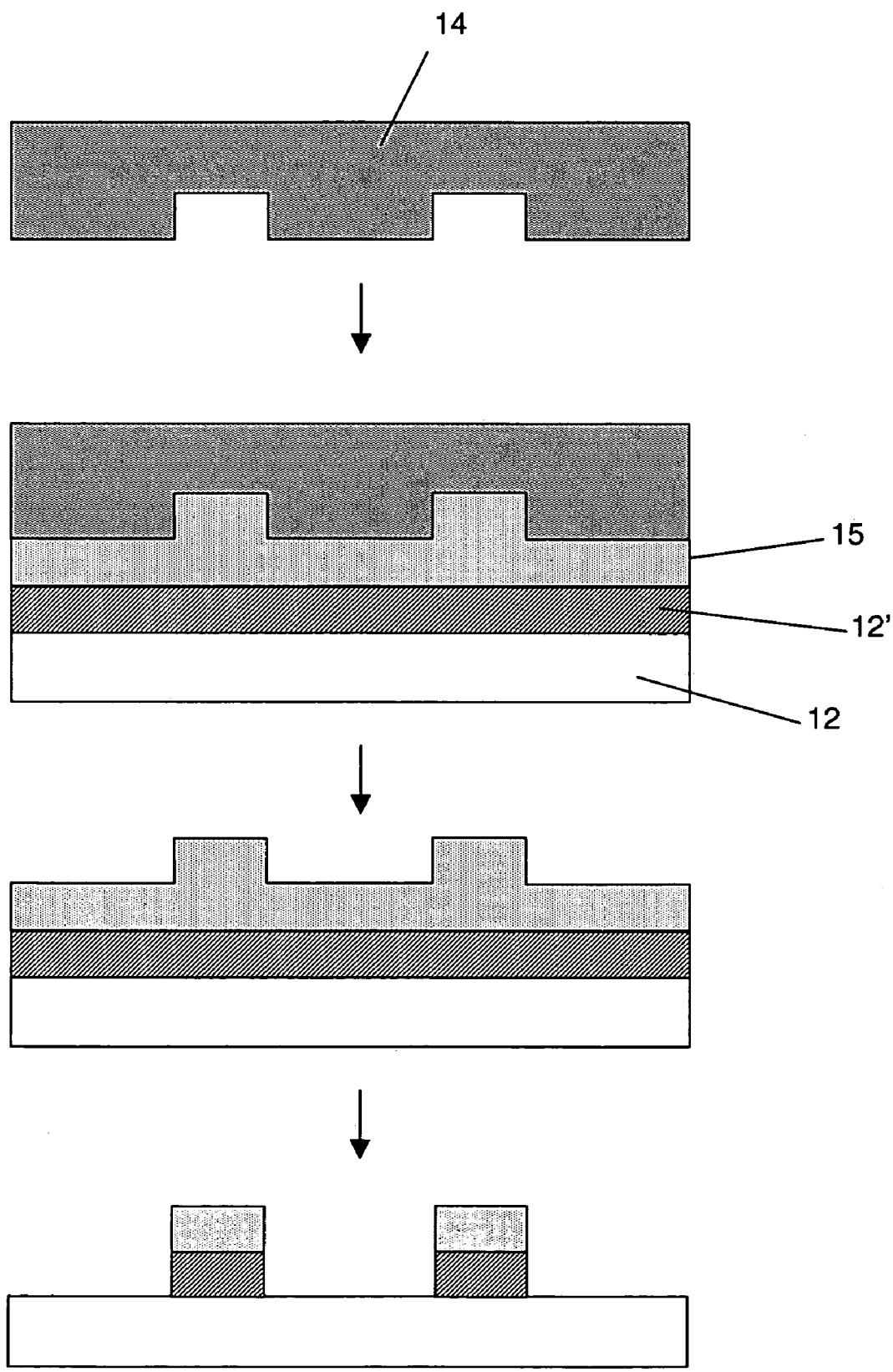
Figure 1C:
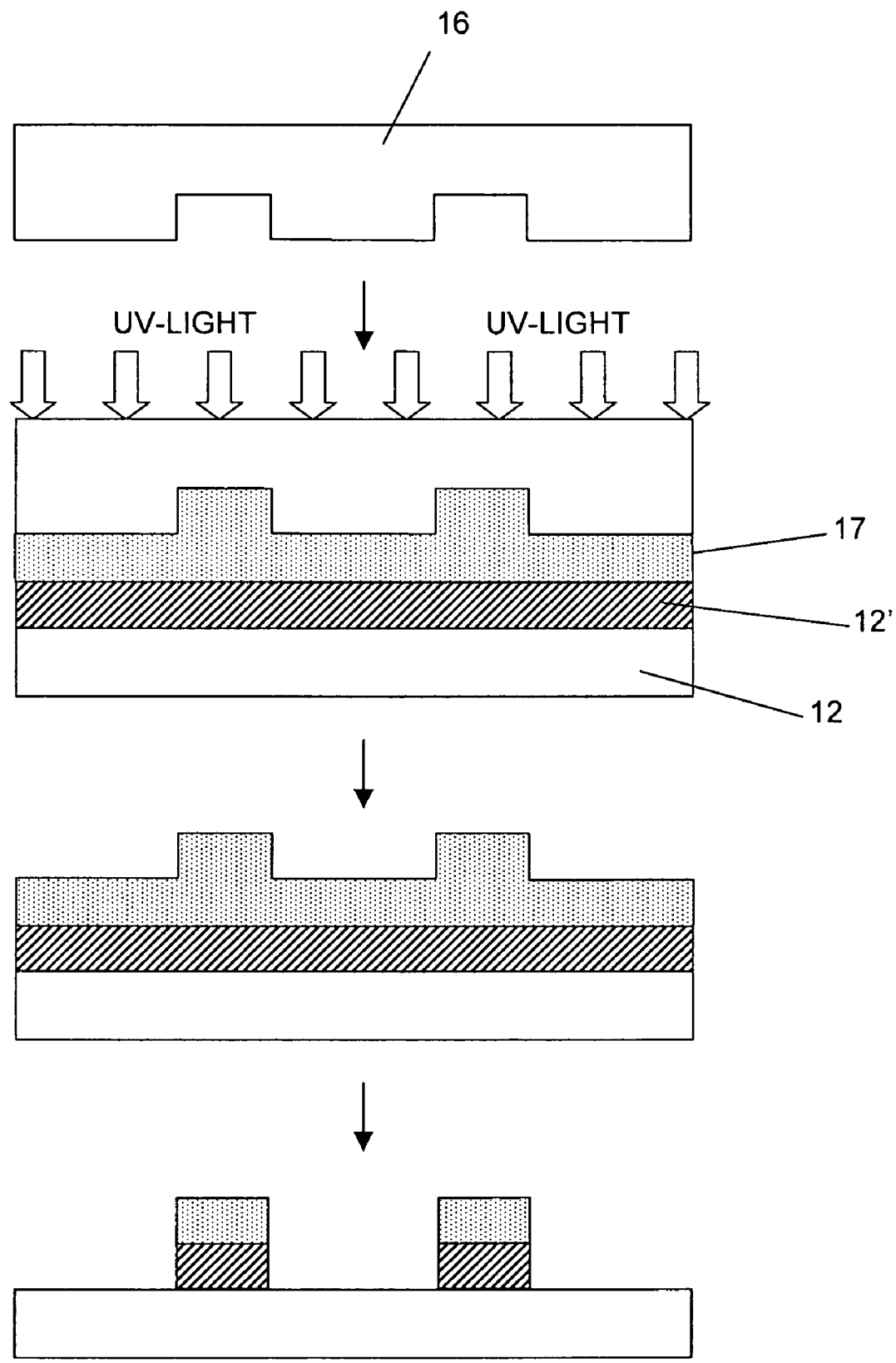
Figure 2A:
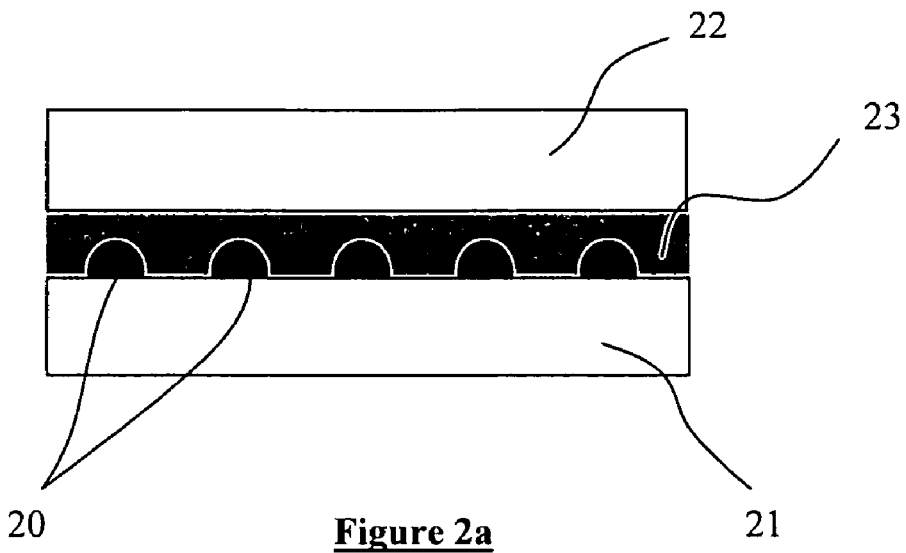
FIGS. 2a and 2b schematically show the flow of liquid and gas during an imprint process.

FIG. 2a schematically shows an imprint process, specifically a hot imprint process or a UV imprint process. An imprint template 22 is positioned directly above the substrate 21. Droplets of imprint liquid 20 are shown deposited on a substrate 21 (although the drops of imprint liquid 20 may be provided on the imprint template 22). A gap is present between the substrate 21 and imprint template 22, and this gap is filled with gas 23.

Figure 2B:
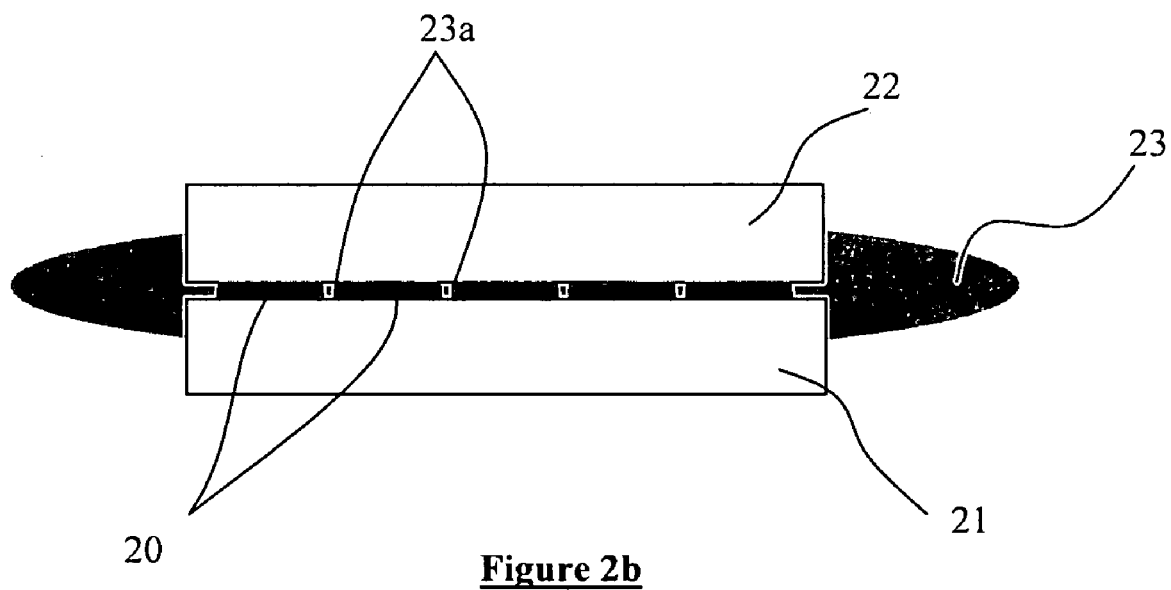

FIG. 2b illustrates the imprint template 22 being brought toward the substrate 21, and/or vice versa, into contact with the imprint liquid 20. As the imprint template 22 comes into contact with the imprint liquid 20, the gap between the imprint template 22 and substrate 21 decreases. At the same time, the area of the substrate 21 covered by each droplet of imprint liquid 20 increases. Therefore, as the gap between the imprint template 22 and substrate 21 decreases, the imprint liquid 20 must flow further. A resistance is encountered, for example, by the imprint template 22 as it is brought towards the substrate 21. This resistance can be attributed to the resistance to flow of the imprint liquid 20 and also due to the compression of gas 23 between the imprint template 22 and substrate 21. Although some gas 23 will be pushed out of the gap between the imprint template 22 and substrate 21 as, for example, the imprint template 22 is brought towards the substrate 21, some gas 23 may remain in small pockets 23a between the imprint template 22 and substrate 21. These gas pockets 23a may be difficult or impossible to move from the imprint pattern, thus causing defects in the imprint pattern formed by the imprint template 22.

It can be seen from FIGS. 2a and 2b that the imprint process shown is slowed due to the increased liquid flows and increased resistance as the gap between the imprint template 22 and substrate 21 decreases. FIGS. 2a and 2b also show that gas pockets 23a can be formed which can cause defects in the imprint pattern. In order to solve one or more these problems, it is proposed to bend the imprint template 22 as it comes into contact with the imprint liquid 20, such that the gap between the imprint template 22 and substrate 21 increases from the center to the edges of the imprint template 22.

Figure 3A:
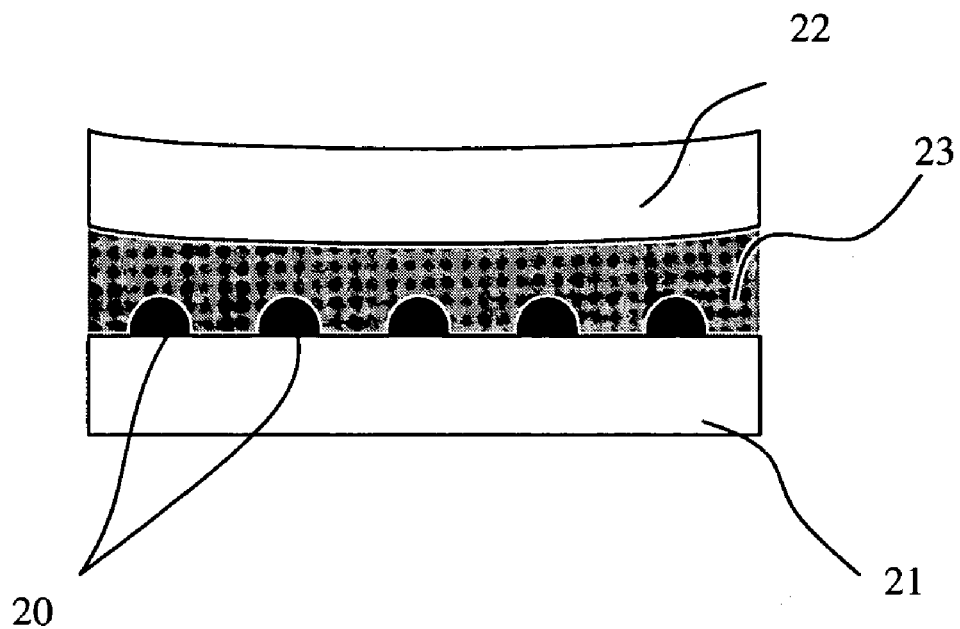
FIGS. 3a and 3b schematically show the flow of liquid and gas during an improved imprint process.
Figure 3B:
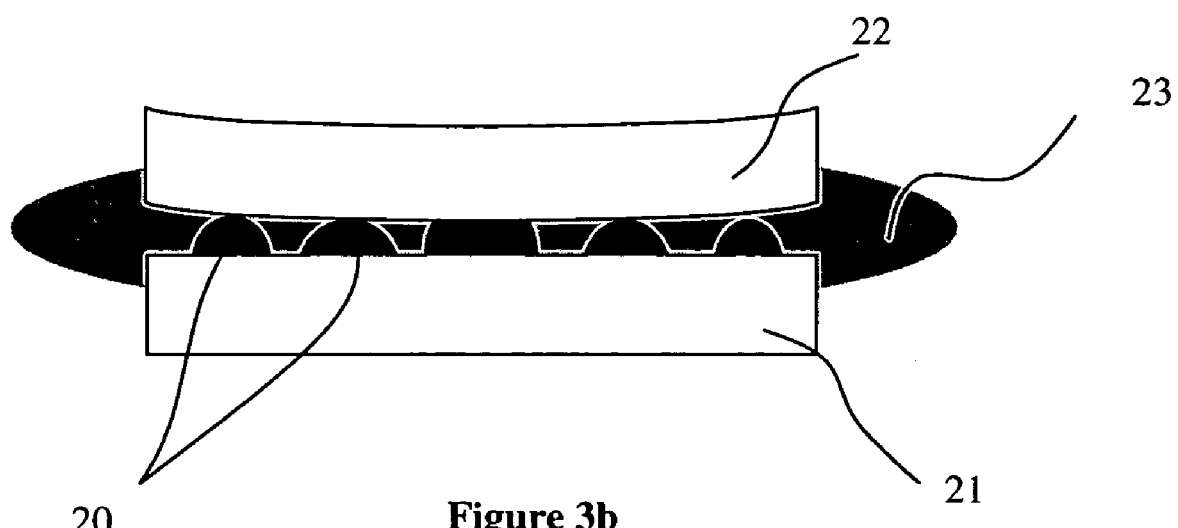

FIG. 3a illustrates a bent template 22. The template is bent such that an outwardly curved surface is used to imprint a pattern onto imprint liquid 20 deposited on the substrate 21. FIG. 3b illustrates the bent imprint template 22 coming into contact with the imprint liquid 20. Because an outwardly curved surface of the imprint template 22 is used to impart a pattern in the imprint liquid 20, the gap between the imprint template 21 and the substrate 22 increases from the center to the edges of the imprint template 22.

Because the gap between the imprint template 22 and substrate 21 increases from the center to the edges of the imprint template 22, the imprint liquid 20 and gas 23 may flow more readily away from the center of the imprint template 22. Since the imprint liquid 20 and gas 23 can flow more readily, there is less resistance encountered by the imprint template 22 when comes into contact with the imprint liquid 20, meaning that the imprint process can be undertaken more rapidly. Furthermore, the chances of gas pockets forming in the imprint pattern can be reduced since the gas 23 is pushed away from the center of the imprint template 22 due to the curvature of the imprint template 22.

Once the bent imprint template 22 comes into contact with the imprint liquid 20, the imprint template 22 can be flattened onto the imprint liquid 20 to imprint a pattern into the imprint liquid 20.

In order to bend the imprint template 22, it is proposed to use a pressure chamber provided at the side of the imprint template 22 which does not come into contact with the imprint liquid (i.e. the "backside" of the imprint template 22). The pressure within the pressure chamber is increased or decreased to bend the imprint template. However, a disadvantage of the use of a pressure chamber on the backside of the imprint template is that it must be located on the backside of the imprint template in order to apply these changes in pressure. The use of a pressure chamber may therefore obstruct a path of UV-radiation used to, for example, cure the imprint liquid 20. Another problem is that the use of a pressure chamber may impose severe constructional limitations, in that the pressure chamber would need to be kept gas tight. It is possible that due to changes in pressure in the pressure chamber, the imprint template 22 may even bend the opposite way to that intended, which is undesirable.

Figure 4A:
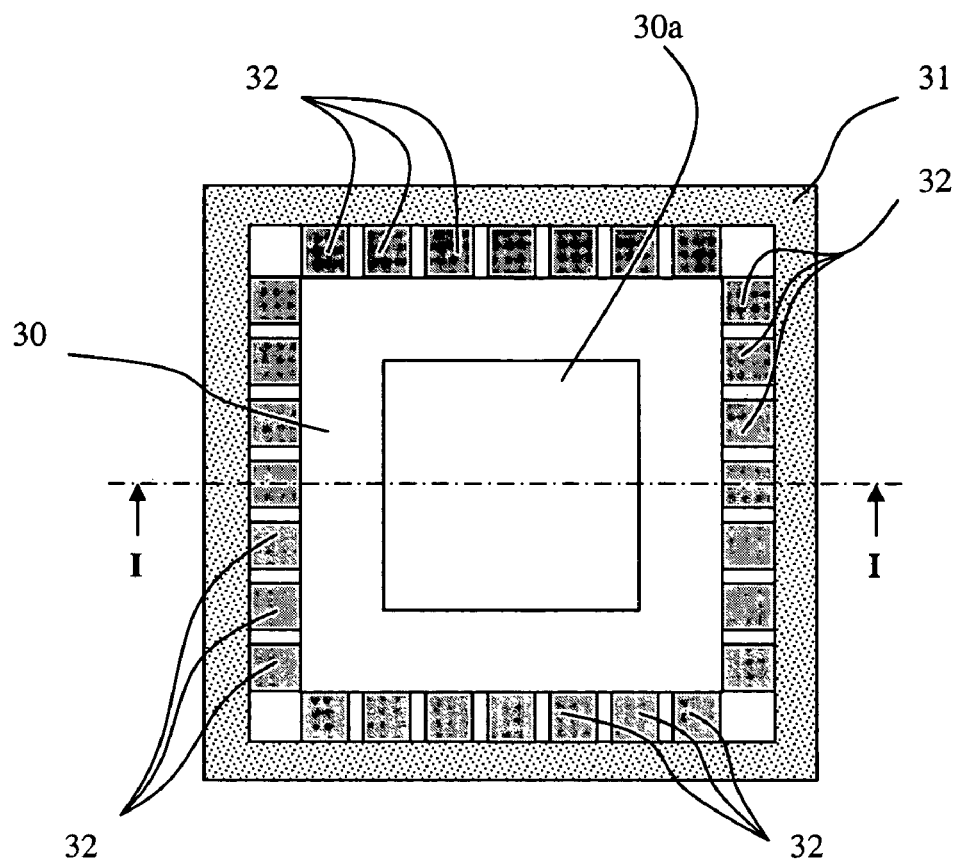
FIGS. 4a and 4b schematically show an imprint apparatus according to an embodiment of the invention.
Figure 4B:
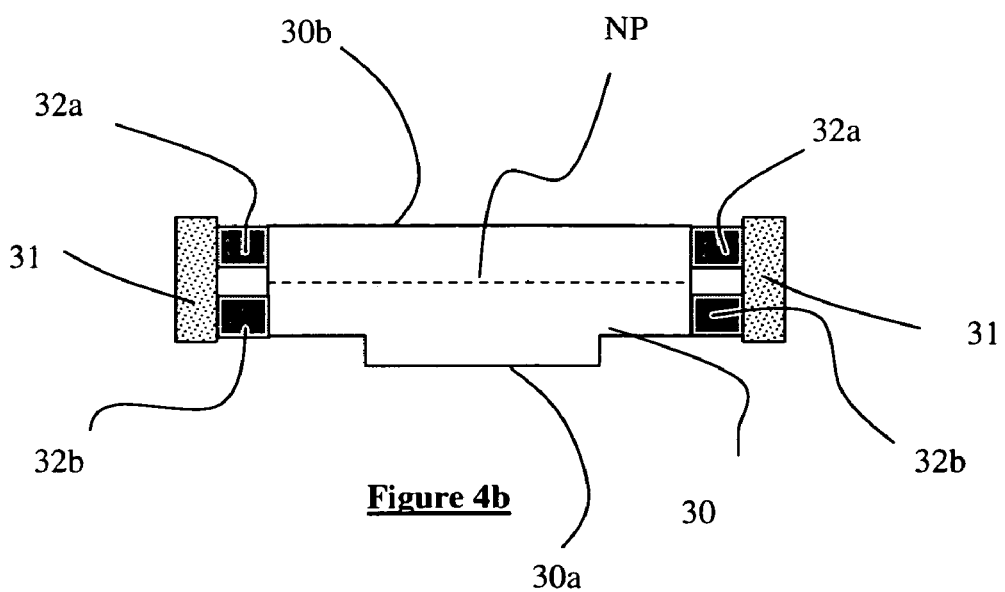

FIGS. 4a and 4b illustrate an imprint apparatus according to an embodiment of the invention. FIG. 4a shows an underside view of the apparatus, and FIG. 4b illustrates a part section view of the apparatus of FIG. 4a taken along the line I-I.

The apparatus includes an imprint template 30, which is substantially planar in shape. The imprint template 30 has two substantially square surfaces, one of which is provided with a patterned region 30a, and the other of which is known as the 'backside' 30b (i.e. the non-patterning region of the imprint template 30). The imprint template 30 also has four peripheral sides which extend around the imprint template 30. Extending around the periphery of the imprint template 30 is a support structure 31. The support structure 31 holds the imprint template 30 in position using piezoelectric elements 32 which press against the peripheral faces of the imprint template 30. Alternatively, the piezoelectric elements 32 may be accommodated in one or more recesses or guides (etc.) in the imprint template 30.

FIG. 4a shows that each side of the imprint template 30 is supported by, for example, seven piezoelectric elements 32. However, it can be seen from FIG. 4b that there are two layers of piezoelectric elements attaching the imprint template 30 to the support structure 31. A first layer of piezoelectric elements 32a are located above the neutral plane NP of the imprint template 30. A second layer of piezoelectric elements 32 are located below the neutral plane NP of the imprint template 30. The first and second layers of piezoelectric elements 32a, 32b, extend substantially parallel to one another, and along each respective side of the support structure 31.

When loaded in pure bending, the neutral plane NP of the imprint template 30 is a plane where compression and tension stresses are zero. The neutral plane NP extends through and across the imprint template 30 and substantially bisects each of the imprint template's 30 peripheral faces. If a force directed towards the center of the imprint template 30 is applied to the peripheral faces of the imprint template 30, the imprint template 30 can be made to bend up or down (in relation to the orientation of the imprint template 30 shown in FIG. 4b) depending on whether the force is applied above or below the neutral plane NP. In general, the imprint template 30 can be made to bend by applying a force to a side of the imprint template, the force being applied at a position displaced from the neutral plane which substantially bisects the side.

Figure 5A:
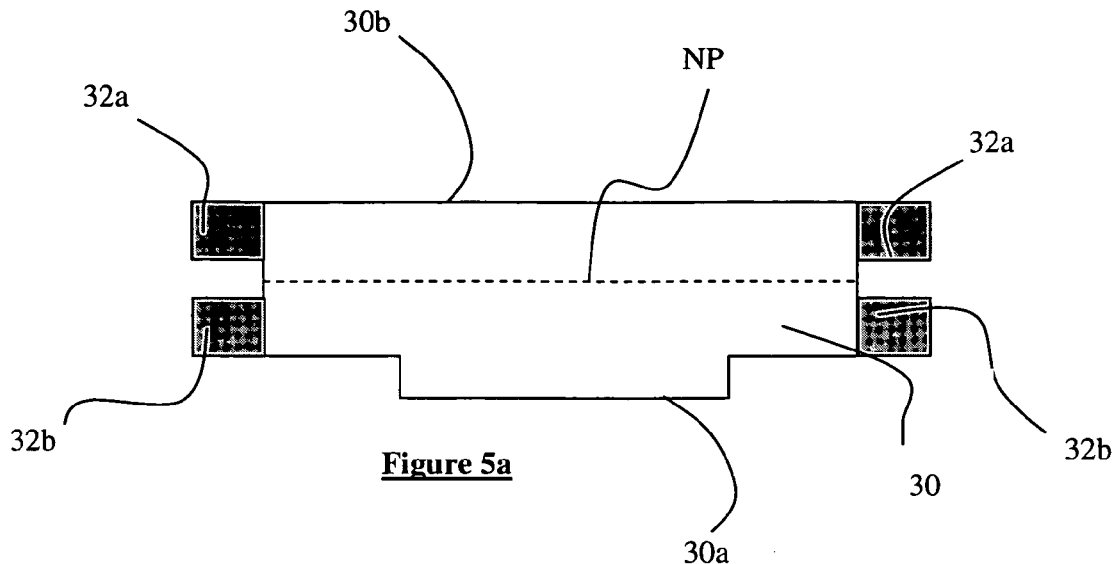
FIGS. 5a-c schematically show use of the apparatus of FIGS. 4a and 4b.

FIGS. 5a to 5a illustrate how the layers of piezoelectric elements 32a, 32b may be used to bend the imprint template 30. It can be seen from FIG. 5a that when no potential difference is applied across the layers of piezoelectric elements 32a, 32b, the piezoelectric elements 32a, 32b, do no expand or contract, meaning that no forces are applied towards or away from the peripheral faces of the imprint template 30.

Figure 5B:
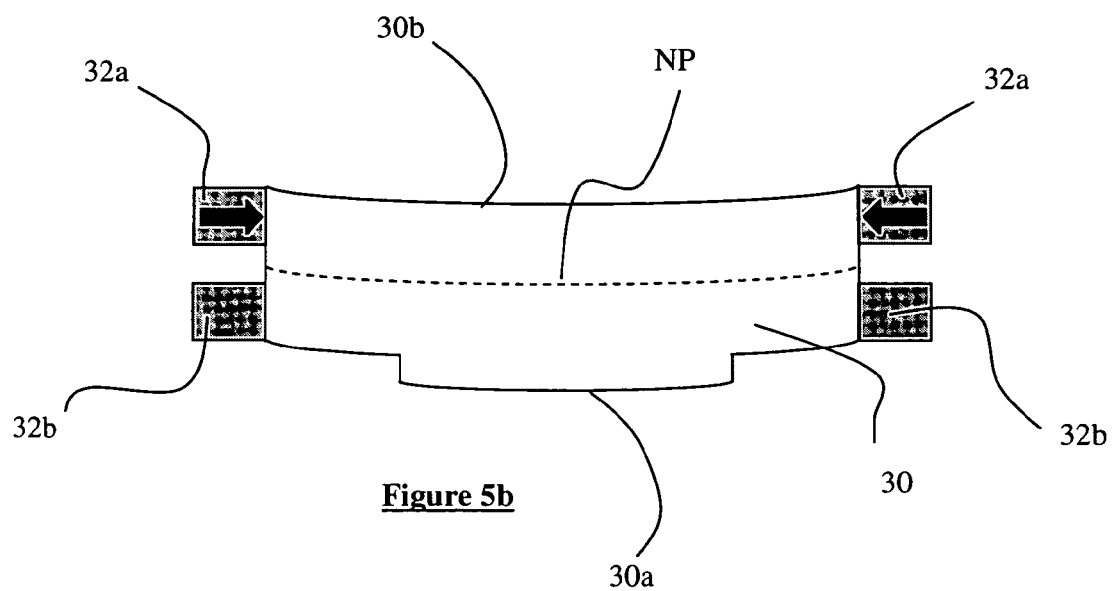

In FIG. 5b, a voltage has been applied across the first layer of piezoelectric elements 32a such that they apply a force towards the center of the template 31 and above the neutral plane NP. It can be seen that application of such a force causes the imprint template to bend downwards. Thus, FIG. 5b shows that when a voltage is applied across the upper layer of piezoelectric elements 32a, the piezoelectric elements 32a push against a peripheral edge of the imprint template 30 above the neutral plane NP of the imprint template 30. When the upper layer of piezoelectric elements 32a are made to apply such a force, the imprint template 30 is forced to bend downwards, which also causes the patterned region 30a of the imprint template 30 to bend downwards.

When the imprint template 30, including the patterned region 30a, has been made to bend downwards, the imprint template 30 can be used in the same way as described in relation to the bent template 22 of FIGS. 3a and 3b. Once the bent imprint template 30 comes into contact with imprint liquid deposited on a substrate, the forces applied to the imprint template by the upper layer of piezoelectric elements 32a may be removed (i.e. the voltage across the upper layer of piezoelectric elements 32a are reduced to zero). When, for example, the force applied to the imprint template above its neutral plane NP has been removed, the imprint template 30 will relax to a flattened state, causing the patterned region 30a of the imprint template 30 to also relax to a flattened state. When the patterned area 30a of the imprint template 30 relaxes to a flattened state, the outer edges of the pattern of the patterned region 30a will come into contact with the imprint liquid, expelling liquid and gas as the template 30 flattens to form a continuous layer of liquid. Once the imprint template 30 is flattened, a pattern may be permanently imprinted into the imprint liquid on the substrate (e.g. by heating or cooling the liquid, or by exposing it to UV radiation).

Figure 5C:
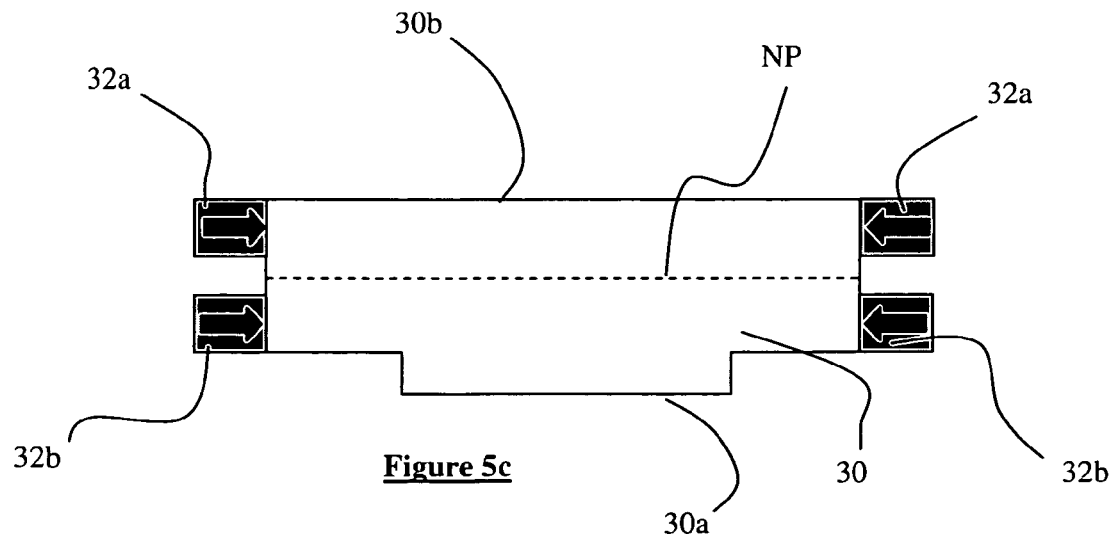

FIG. 5c illustrates how the imprint template may be straightened (i.e. unbent) by the application of forces above and below the neutral plane NP. A potential difference may be applied across the upper layer of piezoelectric elements 32a and also across the lower layer of piezoelectric elements 32b, so that an equal force is applied above and below the neutral plane NP of the imprint template 30. The application of such forces above and below the neutral plane NP flatten the imprint template 30, and can be used to gradually flatten the imprint template 30 as it comes into contact with the imprint liquid. Alternatively (as described above) the imprint template can be made to flatten by not applying forces to the side of the imprint template, and allowing the imprint template to relax to a flattened state.

Figure 6:
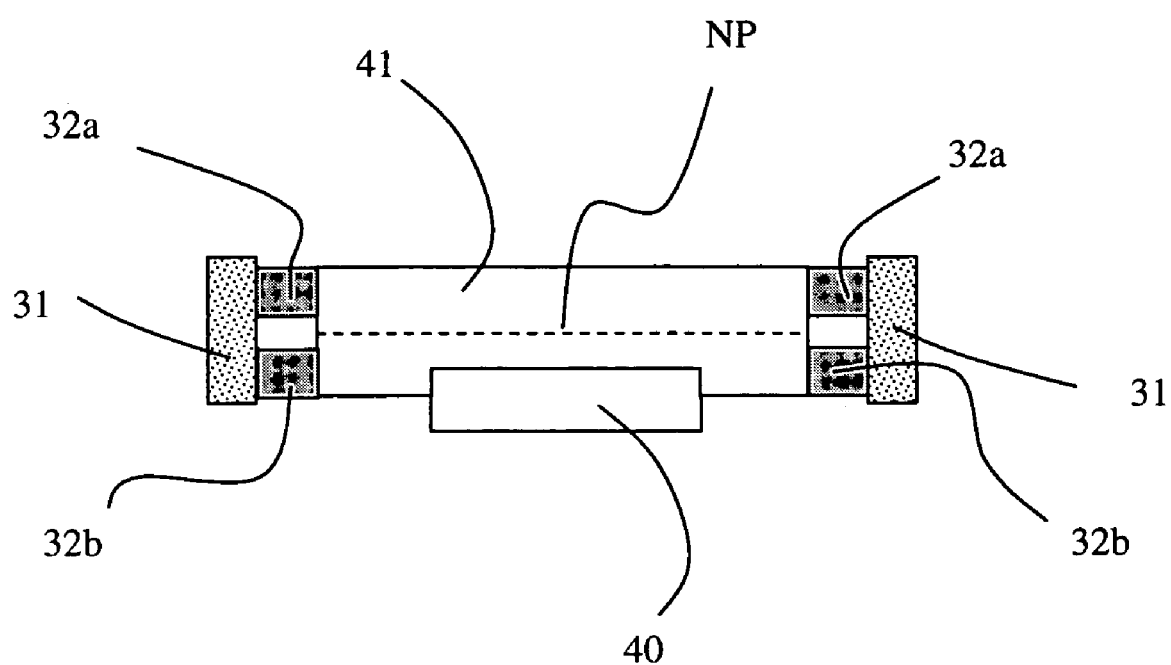
FIG. 6 schematically shows another embodiment of the invention.

The embodiments of FIGS. 4 and 5 have been described with reference to an. imprint template 30 supported by a support structure 31. An alternative embodiment is illustrated in FIG. 6. In FIG. 6, an imprint template 40 is held by a template holder 41. The template holder 41 is then supported by a support structure 31 via the piezoelectric elements 32, in the same manner as described above. The parts of the description of FIGS. 4 and 5 relating to how the imprint template 30 is bent apply equally to the bending of the template holder 41 of FIG. 6. A force applied to the side of the imprint holder 41, displaced from its neutral plane NP, will cause it to bend. The imprint template 40 is held by the template holder 41 in such a way that bending of the template holder 41 causes the imprint template 40 to bend.

The template holder 41 may be removable from the support structure 31, or may be fixed to it by way of the piezoelectric elements 32. The template holder 41 may releasably hold an imprint template 40 so that different imprint templates may be used with the imprint holder. The imprint template 40 may be held in position by the template holder 41 using any suitable means, for example electrostatic force, glue or other fixing fluid or a mechanical means such as nut and bolt or other fastener.

In the above embodiments, the application of forces above and below the neutral plane NP of the imprint template 30 have been described in a simple on-off manner. For example, application of a force above the neutral plane NP of the imprint template 30 will cause the imprint template 30 to bend downwards. However, it will be appreciated that bending of the imprint template 30 can be achieved by applying forces of different magnitudes above and below the neutral plane NP of the imprint template 30. If the force applied above the neutral plane NP is greater than the force applied below the neutral plane NP, the imprint template 30 will bend downwards (in the orientations shown in the Figures). If the force applied below the neutral plane NP is greater than the force applied above the neutral plane NP, the imprint template will bend upwards. If the forces applied above and below the neutral plane are substantially equal, the imprint template 30 will remain flat, or return to a flat state from a bent state.

It will be appreciated that the number, type and arrangement of the piezoelectric elements may vary depending on the desired amount of bending of the imprint template, and the structure of the imprint template itself. For example, for an imprint template having an area of 30 mm$^2$ with a 25 mm$^2$ patterned region, a particularly suitable arrangement of piezoelectric elements may be to have two layers. (an upper and lower layer) of piezoelectric elements disposed on each of the four sides of the imprint template, and for each of those layers to have seven piezoelectric elements. If each of the piezoelectric elements of the upper layer could generate a force of 130 N, a distributed pressure of 10 N/mm$^2$ may be applied to the upper half of the template, which should be sufficient to bend the imprint template to the required extent. Alternatively, instead of providing seven piezoelectric elements in each layer, a single elongate piezoelectric element may be provided in each layer, e.g. generating approximately 900 N of force. Any suitable number of piezoelectric elements may be used.

The amount of bending of the imprint template 30 may depend on the imprint liquid deposited on the substrate. For example, if the imprint liquid is deposited on the substrate in the form of droplets, it may be useful to ensure that the bending of the imprint template exceeds the height of the droplets at the outer edges of the substrate. This is to ensure that the imprint liquid and gas have space to flow into, therefore reducing the resistance to the imprint template coming into contact with the imprint liquid. For example, if the droplets of imprint liquid are less than or equal to about 20 micrometers in height, the bending of the imprint template 30 may be arranged such that the difference in height between the center of the bent imprint template 30 and the outer edges of the imprint template 30 is approximately 30 micrometers. However, it will be appreciated that the bending may be more exaggerated, for example inducing a difference in height between the center and outer edges of around 100 micrometers. The exact amount of bending of the imprint template 30 may depend upon various process criteria, for example the nature of the imprint liquid and the required speed of the imprint process.

When the bent imprint template has been flattened onto the imprint liquid, it is possible that corrections may be required to the imprint pattern before it is permanently set in the imprint liquid. For example, the imprint template may be distorted which, if not corrected, would cause a distortion in the patterned imprinted in the imprint liquid. The distortions may be corrected by applying forces to different points along the sides of the imprint template. In another example, the pattern may need to be slightly magnified or de-magnified, in which case forces can be applied at opposite sides of the imprint template to magnify or de-magnify the pattern. The exact nature of the required corrections (e.g. magnitude of the forces) may be determined from experimental trials, or from computer modeling.

It will be appreciated that when a voltage is applied across the piezoelectric element 32 to cause it to induce a force on the imprint template 30, an equal and opposite force will act on the support structure 31 to which the piezoelectric element is attached. In order to prevent the support structure 31 from distorting due to the forces induced by the piezoelectric element 32, the support structure 31 may be structurally reinforced.

It will also be appreciated that a piezoelectric element need not necessarily apply a force on opposite sides of the template to bend it. For example, a piezoelectric element could apply a force to one side of the imprint template, pushing the template against an abutment surface. The abutment surface would provide an equal and opposite reaction force, causing the template to bend.

In the embodiments described above, the use of piezoelectric elements 32 to apply a force above and below the neutral plane NP of an imprint template 30 has been described. However, it will be appreciated that the use of piezoelectric elements 32 is not essential. All that is required is that forces may be applied to the imprint template 30 above and/or below the neutral plane NP of the imprint template 30 such that the imprint template 30 is made to bend. The forces are applied to the peripheral faces (i.e. sides) of the imprint template. It will be appreciated that these forces may applied in any one of a number of suitable ways. For example, instead of using piezoelectric elements 32, one or more hydraulic miniature pistons may be used, or one or more compact linear electrical motors and levers (a lever being used to magnify the force generated by a linear motor to generate a force of sufficient magnitude to bend the imprint template). Alternatively or additionally, heat may be applied to one or more sections of the imprint template to cause it to expand in certain places, and consequently bend. The heat may be applied directly (e.g. using one or more heated elements), or by irradiating the one or more sections of the imprint template using infra-red radiation. Any one or more suitable actuator capable of imparting a force on the imprint template 30 may be used. The actuators may be individually controllable, so that the forces applied to the template may be accurately controlled. One or more rows of actuators may be used. The rows may extend parallel to one another, and be positioned on either side of the neutral plane.

Since the forces are applied to the peripheral faces of the imprint template 30, the backside of the imprint template 30 is not obscured, as it is with the above-noted pressure chamber idea for bending the template 30.

If the piezoelectric elements (or whichever elements capable of imparting a force are used) are attached or connected to the imprint template, forces may be employed which pull, and not necessarily push against, the imprint template. Bending of the imprint template may then be achieved by pushing against and/or pulling on the peripheral edges of the imprint template, above or below its neutral plane. In general, the bending of the imprint template is dictated by the difference in the magnitude of the forces applied above and below the neutral plane of the imprint template.

While one or more embodiments have been described in relation to imprint liquid, it will be appreciated that one or more embodiments may be applied more generally to imprintable material, which may include imprint liquid.

It will be appreciated by one of ordinary skill in the art that the above embodiments have been given by way of example only. It will be appreciated that the various modifications may be made to these an other embodiments without departing from the invention, which is defined by the claims that follow.

What is claimed is:

1. An imprint lithography apparatus, comprising:
    a support structure configured support an imprint template, the imprint template having a neutral plane which substantially bisects the imprint template; and
    an actuator located in a position such that, when the imprint template is supported by the support structure, the actuator is located between the support structure and a side of the imprint template, wherein the actuator is configured to meet the imprint template above or below and away from the neutral plane of the imprint template and at such meeting of the imprint template, apply at least initially a force at a location which is above or below the neutral plane of the imprint template but not at the neutral plane of the imprint template.

2. The imprint lithography apparatus of claim 1, wherein an actuator is located on each side of the neutral plane of the imprint template, when the imprint template is supported by the support structure.

3. The imprint lithography apparatus of claim 1, wherein a further actuator is provided on an opposite side of the support structure to meet an opposite side of the imprint template.

4. The imprint lithography apparatus of claim 1, wherein the actuator is one of a plurality of actuators.

5. The imprint lithography apparatus of claim 4, wherein the actuators are individually controllable.

6. The imprint lithography apparatus of claim 4, wherein the actuators form a row extending along a side of the support structure.

7. The imprint lithography apparatus of claim 4, wherein the actuators form two rows extending along a side of the support structure:

8. The imprint lithography apparatus of claim 7, wherein the two rows are substantially parallel to one another.

9. The imprint lithography apparatus of claim 4, wherein seven actuators are provided.

10. The imprint lithography apparatus of claim 1, wherein the actuator is a piezoelectric element.

11. An imprint lithography apparatus, comprising:
    an imprint template holder, suitable to hold an imprint template, the imprint template holder being supported by a support structure; and
    an actuator located between the support structure and a side of the imprint template holder, the imprint template holder having a neutral plane which substantially bisects the imprint template holder, wherein the actuator at least initially meets the imprint template holder above or below and away from the neutral plane of the imprint template holder and is configured to, at such meeting of the imprint template, apply a force at a location which is displaced from the neutral plane of the imprint template holder but not to apply a force at the neutral plane of the imprint template holder.

12. The imprint lithography apparatus of claim 11, wherein an actuator is located on each side of the neutral plane of the imprint template holder.

13. The imprint lithography apparatus of claim 11, wherein a further actuator is provided on an opposite side of the support structure to meet an opposite side of the imprint template holder.

14. The imprint lithography apparatus of claim 11, wherein the actuator is one of a plurality of actuators.

15. The imprint lithography apparatus of claim 14, wherein the actuators are individually controllable.

16. The imprint lithography apparatus of claim 14, wherein the actuators form a row extending along a side of the support structure.

17. The imprint lithography apparatus of claim 14, wherein the actuators form two rows extending along a side of the support structure.

18. The imprint lithography apparatus of claim 17, wherein the two rows are substantially parallel to one another.

19. The imprint lithography apparatus of claim 14, wherein seven actuators are provided.

20. The imprint lithography apparatus of claim 11, wherein the actuator is a piezoelectric element.

21. An imprint lithography apparatus, comprising:
    a support structure configured support an imprint template; and
    an actuator located in a position such that, when the imprint template is supported by the support structure, the actuator is located between the support structure and a side of the imprint template, wherein the actuator is configured to cause the template to bend and form an outwardly curved surface having a difference in height of about 30 micrometers or greater between the center of the outwardly curved surface and an edge of the template.

22. The imprint lithography apparatus of claim 21, wherein the actuator is configured to meet the imprint template at a location which is displaced from a neutral plane of the imprint template, the neutral plane substantially bisecting the imprint template.

23. The imprint lithography apparatus of claim 21, wherein an actuator is located on each side of a neutral plane of the imprint template, when the imprint template is supported by the support structure, the neutral plane substantially bisecting the imprint template.

24. The imprint lithography apparatus of claim 21, wherein the actuator is one of a plurality of actuators, wherein the actuators form two rows extending along a side of the support structure.

25. The imprint lithography apparatus of claim 24, wherein the two rows are substantially parallel to one another.

26. An imprint lithography apparatus, comprising:
    a support structure configured support an imprint template; and
    a plurality of actuators located in a position such that, when the imprint template is supported by the support structure, the actuators are located between the support structure and a side of the imprint template, wherein a first actuator of the plurality of actuators is configured to apply a force to the imprint template or an imprint template holder to hold the imprint template, at a first location which is displaced perpendicularly away from the neutral plane of the imprint template or of the imprint template holder, and a second actuator of the plurality of actuators is configured to apply a separate force to the imprint template or the imprint template holder at a second location which is displaced perpendicularly away from the neutral plane, the first location being on a first side of the neutral plane having the patterning region surface of the imprint template and the second location being on a second side of the neutral plane having the non-patterning region surface of the imprint template, the first side being opposite across the neutral plane of the second side.

27. The imprint lithography apparatus of claim 26, comprising a plurality of first actuators forming a row extending along a side of the support structure.

28. The imprint lithography apparatus of claim 26, comprising a plurality of first actuators forming a row extending along a side of the support structure and a plurality of second actuators forming a row extending along the side of the support structure.

29. The imprint lithography apparatus of claim 28, wherein the row of first actuators and the row of second actuators are substantially parallel to one another.

30. The imprint lithography apparatus of claim 26, wherein the actuators are piezoelectric elements.

* * * * *